United States Patent
Aronowitz et al.

[11] Patent Number: 6,087,229
[45] Date of Patent: Jul. 11, 2000

[54] COMPOSITE SEMICONDUCTOR GATE DIELECTRICS

[75] Inventors: Sheldon Aronowitz; David Chan; James Kimball; David Lee, all of San Jose; John Haywood, Santa Clara; Valeriy Sukharev, Cupertino, all of Calif.

[73] Assignee: LSI Logic Corporation, Milpitas, Calif.

[21] Appl. No.: 09/037,588

[22] Filed: Mar. 9, 1998

[51] Int. Cl.$^7$ .................................................. H01L 21/336
[52] U.S. Cl. ..................... 438/287; 257/324; 257/411; 438/591; 438/775; 438/786
[58] Field of Search ...................... 438/216, 287, 438/587, 588, 591, 762, 769, 770.3, 775, 778, 787, 788, 791, 792, 954, FOR 177, 193, 494, 402, 261–64, 532, 786, 761; 257/324, 411

[56] References Cited

U.S. PATENT DOCUMENTS

| | | | |
|---|---|---|---|
| 4,621,277 | 11/1986 | Ito et al. | 257/313 |
| 4,913,929 | 4/1990 | Moslehi et al. | 427/564 |
| 5,258,333 | 11/1993 | Shappir et al. | 438/762 |
| 5,422,291 | 6/1995 | Clementi et al. | 438/762 |
| 5,464,783 | 11/1995 | Kim et al. | 438/762 |
| 5,834,351 | 11/1998 | Chang et al. | 438/769 |
| 5,837,598 | 11/1998 | Aronowitz et al. | 438/532 |
| 5,888,870 | 3/1999 | Gardner et al. | 438/261 |
| 5,904,523 | 5/1999 | Feldman et al. | 438/775 |
| 5,960,289 | 9/1999 | Tsui et al. | 438/775 |
| 5,969,397 | 10/1999 | Grider, III et al. | 257/411 |

*Primary Examiner*—Olik Chaudhuri
*Assistant Examiner*—Anh Duy Mai
*Attorney, Agent, or Firm*—Beyer Weaver Thomas & Nguyen, LLP

[57] ABSTRACT

Provided are methods for fabricating hardened composite thin layer gate dielectrics. According to preferred embodiments of the present invention, composite gate dielectrics may be produced as bilayers having oyxnitride portions with nitrogen contents above 10 atomic percent, while avoiding the drawbacks of prior art nitridization methods. In one aspect of the present invention, a hardened composite thin layer gate dielectric may be formed by deposition of a very thin silicon layer on a very thin oxide layer on a silicon substrate, followed by low energy plasma nitridization and subsequent oxidation of the thin silicon layer. In another aspect of the invention, low energy plasma nitridization of a thin oxide layer formed on a silicon substrate may be followed by deposition of a very thin silicon layer and subsequent oxidation, or additional low energy plasma nitridization and then oxidation, of the thin silicon layer.

26 Claims, 6 Drawing Sheets

COMPOSITE SEMICONDUCTOR GATE DIELECTRICS

CROSS-REFERENCE TO RELATED APPLICATIONS

This application is related to U.S. application Ser. No. 09/038,684 entitled VARIABLE THICKNESS DIELECTRICS IN ANALOG DEVICES, filed concurrently herewith, and which is incorporated by reference herein for all purposes.

BACKGROUND OF THE INVENTION

This invention relates generally to semiconductor fabrication, and particularly to dielectric and barrier layers used in semiconductor fabrication. More specifically, the invention relates to methods of fabrication of hardened composite semiconductor gate oxides.

FIGS. 1A through C illustrate steps in a conventional semiconductor fabrication process on a portion of a semiconductor wafer 100. In FIG. 1A, a semiconductor substrate 101 is shown. The substrate 101 has a gate oxide layer 104 formed on its upper surface 102. The gate oxide layer 104 may be created in ways well known to those of skill in the art. For example, the gate oxide may be silicon dioxide ($SiO_2$) generated by thermal oxidation of surface 102 of the silicon substrate 101, or may be deposited on the silicon substrate 101 by chemical vapor deposition (CVD). Typical conventional gate oxide thicknesses, for example for semiconductor devices having gate lengths from about 0.18 to 1 $\mu$m, are about 25 to 200 Å.

As shown in FIGS. 1B and 1C, a polysilicon (poly) layer 106 is typically deposited over the following gate oxide layer 104, for example by CVD. FIG. 1B shows the wafer 100 with the poly layer 106 on the gate oxide layer 104. FIG. 1C shows the wafer 100 after the poly layer 106 has been patterned and etched to form a gate electrode 108, according to methods well known in the art. The gate electrode 108 may then be used as a mask in a self-aligned implant process to produce doped active source 110 and drain 112 regions in the substrate 101, on either side of the gate electrode 108, thereby forming an MOS transistor.

As semiconductor technology develops, semiconductor device geometries have been reduced. As a result, the various components that make up a semiconductor have been decreased in size. For example, MOS transistor gate widths have been reduced below 0.5 $\mu$m to 0.35 $\mu$m, 0.25 $\mu$m and smaller device sizes are currently being developed. As device sizes decrease, gate dielectric layers in such devices should correspondingly become thinner. For example, in some next generation devices the channel length will be about 0.18 $\mu$m and the gate oxide thickness will be about 30 Å. In future generation devices both the channel length and gate oxide thickness will continue to shrink. However, thinner gate dielectrics are more susceptible to failure. Therefore, it is desirable to increase the capability of thin gate dielectrics, commonly oxides, so that they are better able to withstand the high electric fields to which they are subjected in normal operation of smaller semiconductor devices through a process referred to as "hardening".

Gate oxide hardening is required for at least three reasons. First, insufficiently hard gate oxides can break down at voltages below normal operating voltages. Second, hardened gate oxides are resistant to hot electron degradation which creates structural defects, such as dangling bonds, in gate oxides. Finally, hardened gate oxides may also be effective in preventing diffusion of dopant atoms from the gate electrode through the gate oxide into the substrate. One particularly troubling problem is boron diffusion from a polysilicon gate electrode, through the gate oxide and into the silicon substrate. Boron is mobile at typical processing temperatures. Unwanted dopant diffusion into the substrate will cause fluctuations in the semiconductor device's threshold voltage. This is particularly important in PMOS devices where boron dopant is commonly used in the polysilicon gate electrode.

Conventional methods for hardening gate oxides have involved diffusing nitrogen into a gate oxide after its formation. In this process, the gate oxide is thermally grown on a single crystal silicon substrate. Next, the gate oxide is exposed to an atmosphere containing nitrous oxide, nitric oxide, ammonia or other nitrogen source at a high temperature (about 900° C.) which results in nitrogen incorporation into the gate oxide. The resulting increased concentration of nitrogen containing species in the gate oxide prevents boron diffusion into the silicon substrate, hot electron degradation and improves the breakdown resistance of the gate oxide.

Unfortunately, hardening through nitrogen incorporation through the oxidation process has some drawbacks. Among these problems are that the high temperature treatment involved in gate oxide hardening by nitrogen diffusion cuts into the fabrication process' thermal budget. In addition, hardening with an ammonia anneal introduces electron traps into the dielectric. Furthermore, because the nitrogen tends to localize at the substrate-gate oxide interface, conventional hardening does reduce boron diffusion from the gate oxide to the silicon substrate, but fails to prevent boron diffusion into the gate oxide from a doped polysilicon gate electrode. This is important since the properties of the gate oxide may be adversely affected by creation of traps in oxide by dopants such as boron.

Nitrogen implantation processes in which nitrogen ions are implanted into polysilicon gate electrodes are described in S. Haddad, et al., *IEEE Electron Device Letter*, 8, 58–60, 1987; T. Kuroi, et al., *Tech. Dig. of the Int'l. Electron Devices Mtg.* (IEDM), 325–328, 1993; S. Nakayama et al., 1996 *Symposium on VLSI Technology*, 228–229; A. Chou, et al., *International Reliability Physics Symposium*, 174–177, 1997, which are incorporated by reference herein. These processes produce a nitrogen concentration peak within the bulk polysilicon gate electrode. This effectively suppresses boron diffusion in the polysilicon and therefore cures some of the noted drawbacks in the nitrogen diffusion gate oxide hardening process. Unfortunately, the boron concentration drops off dramatically below the nitrogen concentration peak in the bulk polysilicon. The very low concentration of boron near the gate electrode-gate oxide interface results in formation of polysilicon depletion regions during device operation. Polysilicon depletion regions in the gate electrode act as non-conductive areas that effectively increase gate oxide thickness, thus degrading device performance.

Other nitridization methods have been investigated, including implantation of atomic nitrogen into the single crystal silicon substrate and growth of additional oxide on the substrate surface that incorporates the implanted nitrogen. C. T. Liu et al., *High Performance 0.2 $\mu$m CMOS with 25 Å gate oxide grown on nitrogen implanted Si substrates*, IEDM Technical Digest, 499–502 (1996). However, there are also several significant drawbacks to this approach. In particular, the crystal structure of the silicon substrate is damaged by the implant. In addition, the implant dose is limited by considerations of the effects on the channel behavior of devices with very high residual nitrogen concentrations. As a result, the creation of oxynitride bonds in the oxide layer according to this method is typically practically limited to less than one atomic percent.

It has been reported that surface regions of very thin gate oxide layers (about 4 nm) can be heavily nitridized, for example in the range of about 10 to 20 atomic percent. S. V. Hattangady et al., *Ultrathin nitrogen-profile engineered gate dielectric films*, IEEE International Electron Devices Meeting Technical Digest, 495–498, Dec. 8–11, 1996; D. T. Grider et al., *A 0.18 μm CMOS Process Using Nitrogen Profile-Engineered Gate Dielectrics*, IEEE 1997 Symposium on VLSI Technology Digest of Technical Papers, 47–48, Jun. 10–12, 1997. The technique described therein employs a remote plasma with self-bias. In this case, the equipment provides a plasma where ions will reach the wafer, however, the ion density at the wafer will be less than that of the source of the plasma. This technique relies upon the self-bias of the wafer, for example, by allowing the wafer to electrically "float", to control ion energy.

The work presented in these publications is also limited to very specific applications. The self-bias value depends upon the construction of a particular plasma reactor (processing chamber) and the chosen process parameters that might affect the nitridization reproducibility, including the nature of the wafer surface. The required configurations cannot be determined ab initio using this remote plasma with self-bias system.

Composite dielectric layers have also been proposed, for example, by U.S. Pat. Nos. 5,258,333 and 5,464,783. The '333 patent discloses a process of thermal nitridization of a silicon substrate in pure ammonia, followed by CVD deposition and optional thermal nitridization in $N_2$ of a high temperature oxide layer. The '783 patent involves the formation of an oxynitride layer on a silicon substrate, such as by a thermal anneal in an oxygen and nitrogen-containing atmosphere or by a CVD system using oxygen and nitrogen with silane, dichlorosilane, disilane, or $SiCl_4$ followed by a thermal oxidation step to form an oxide layer at the substrate-oxynitride interface. However, the processes described in these patents rely upon nitridization techniques which do not provide a high degree of control over the incorporation of nitrogen in an oxynitride layer, and are unable to achieve high levels of nitrogen incorporation (i.e., greater than about 10%) in the final oxynitride layer of the composite.

Accordingly, improved nitridization methods for producing hardened thin oxide layers in semiconductor devices without adverse consequences for semiconductor cells would be desirable, particularly as semiconductor device sizes scale below 0.25 μm.

SUMMARY OF THE INVENTION

To achieve the foregoing, the present invention provides methods of fabricating hardened composite thin layer gate dielectrics. According to preferred embodiments of the present invention, composite gate dielectrics may be produced as bilayers having oyxnitride portions with nitrogen contents above 10 atomic percent, while avoiding the drawbacks of prior art nitridization methods. In one aspect of the present invention, a hardened composite thin layer gate dielectric may be formed by deposition of a very thin silicon layer on a very thin oxide layer on a silicon substrate, followed by direct low energy plasma nitridization and subsequent oxidation of the thin silicon layer. In another aspect of the invention, low energy plasma nitridization of a thin oxide layer formed on a silicon substrate may be followed by deposition of a very thin silicon layer and subsequent oxidation, or additional low energy plasma nitridization and then oxidation, of the thin silicon layer.

The invention provides a method of making a composite gate dielectric including providing a silicon oxide layer on a semiconductor substrate, providing a silicon layer on the silicon oxide layer, nitridizing at least one the layers with a direct low energy nitrogen plasma using a remote plasma with active bias on the wafer, and oxidizing the silicon layer to form the composite gate dielectric.

The invention further provides a method of making a composite gate dielectric including providing a silicon oxide layer on a semiconductor substrate, forming a silicon layer on the oxide layer, nitridizing the silicon layer, and oxidizing the nitridized silicon layer to form the composite gate dielectric.

In addition, the invention provides a method of making a composite gate dielectric including providing a layer of silicon oxide on a semiconductor substrate, nitridizing the silicon oxide layer, forming a silicon layer on the nitridized oxide layer, and oxidizing the silicon layer to form the composite gate dielectric. The oxidized silicon layer may also be nitridized by a direct low energy nitrogen plasma with active bias on the wafer prior to the oxidation.

These and other features and advantages of the present invention are described below with reference to the drawings.

DETAILED DESCRIPTION OF PREFERRED EMBODIMENTS

The composite thin layer gate dielectrics of the present invention will now be described with reference to several preferred embodiments. Important properties and characteristics of the preferred embodiments are illustrated in the structures in the text and in the accompanying drawings. While the invention will be described in conjunction with these preferred embodiments, it should be understood that the invention it is not intended to be limited to these preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides methods of fabricating hardened composite thin layer gate dielectrics. According to preferred embodiments of the present invention, composite gate dielectrics may be produced as bilayers having oxynitride portions with nitrogen contents above 10 atomic percent, while avoiding the drawbacks of prior art nitridization methods. In one aspect of the present invention, a hardened composite thin layer gate dielectric may be formed by deposition of a very thin silicon layer on a very thin oxide layer on a silicon substrate, followed by low energy plasma nitridization and subsequent oxidation of the thin silicon layer. In another aspect of the invention, low energy plasma nitridization of a thin oxide layer formed on a silicon substrate may be followed by deposition of a very thin silicon layer and subsequent oxidation, or additional low energy plasma nitridization and then oxidation, of the thin silicon layer.

FIGS. 2A–E show stages in the fabrication of a hardened composite thin gate dielectric according to a preferred embodiment of the present invention. The fabrication process involves deposition of very thin layer of silicon on a very thin layer oxide on a semiconductor wafer, followed by direct low energy plasma nitridization of the thin silicon layer, and subsequent oxidation of the nitridized layer.

Figure 1A:
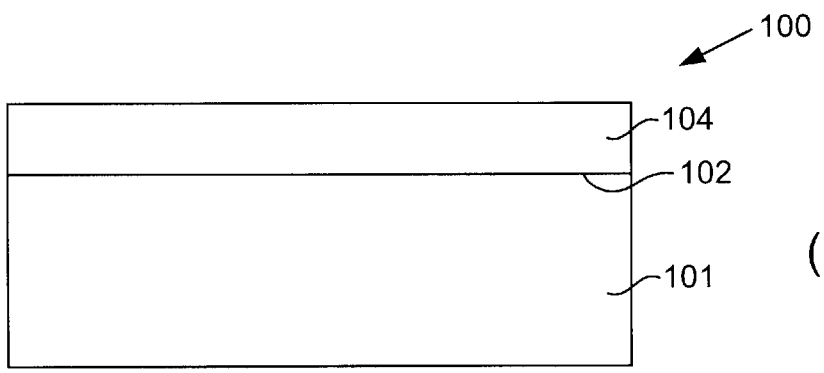
FIGS. 1A–C depict cross-sectional views of stages in the conventional fabrication of a semiconductor device.
Figure 1B:
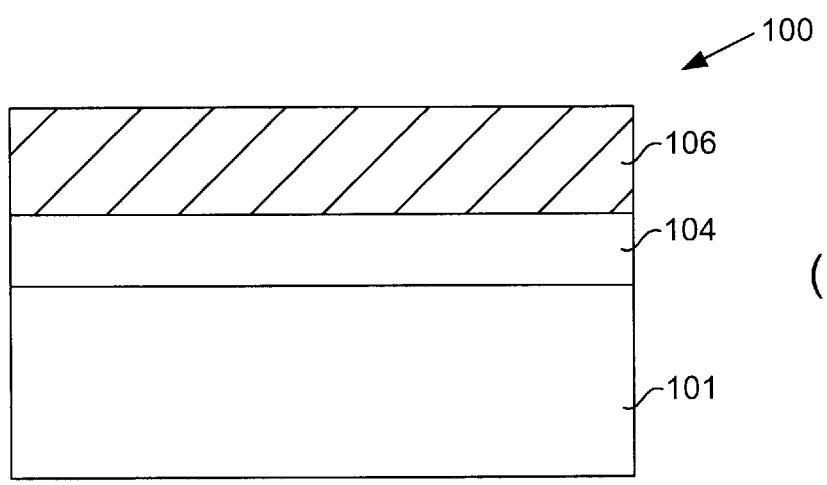
Figure 1C:
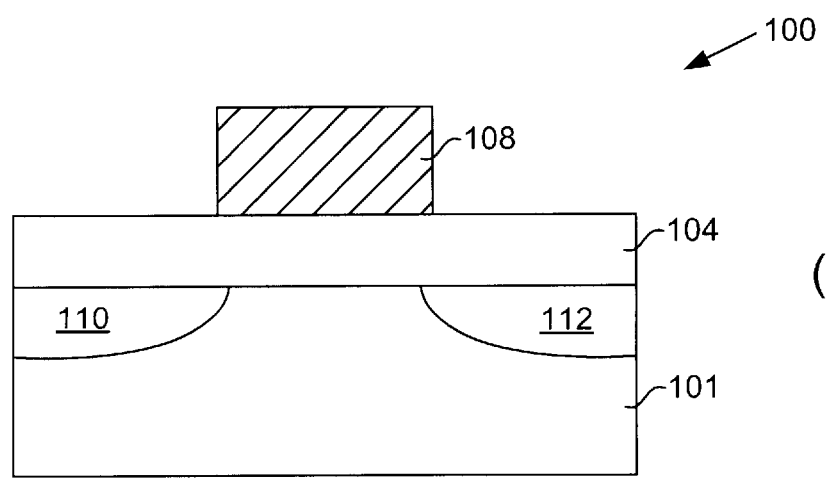
Figure 2A:
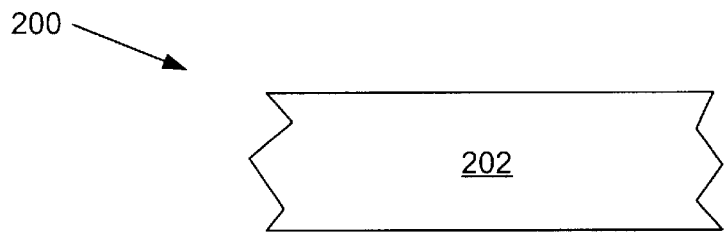
FIGS. 2A–E depict cross-sectional views of stages in the fabrication of a hardened composite thin gate dielectric according to a preferred embodiment of the present invention.
Figure 2B:
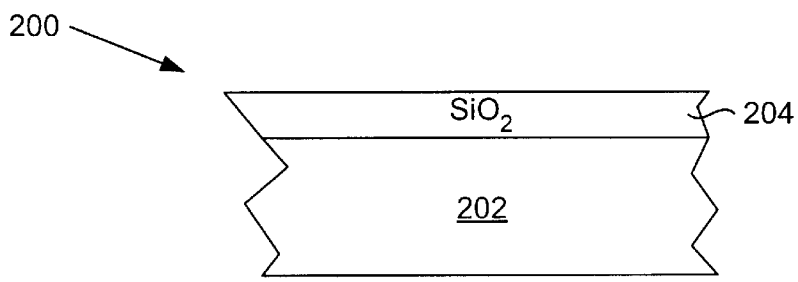

In FIG. 2A, a portion of a semiconductor wafer 200 is shown. The wafer 200 includes a substrate 202, preferably composed of single crystal silicon. In a first stage of this preferred embodiment, shown in FIG. 2B, a very thin layer 204 (for example, less than about 6.0 nm, preferably about 2.5 nm) of gate oxide, preferably silicon dioxide ($SiO_2$), is formed on the substrate 202 according to a method well known to those of skill in the art, such as by thermal treatment.

Figure 2C:
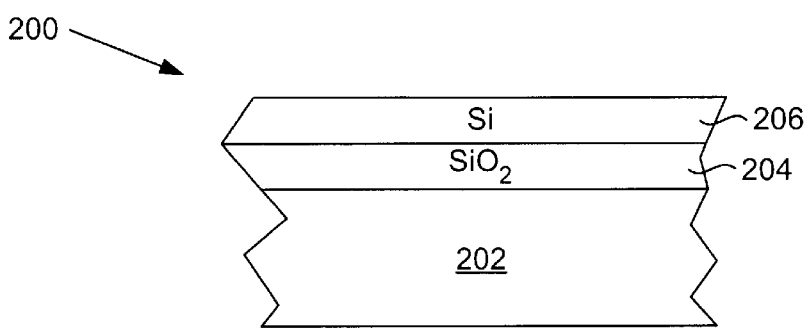

Next, as shown in FIG. 2C, a very thin polysilicon film 206 (for example, less than about 5.0 nm, preferably about 1.2 nm) is deposited on the thin oxide layer 204. The thin film may also be formed from amorphous silicon. Such thin silicon films may be deposited on oxide by adaptation of two standard methods well known to those of skill in the art. The first preferred technique is by low powered (for example, no more than about 500 W) sputtering from a silicon target and using an argon plasma. Amorphous silicon deposition rates of less than about 3.0 nm/minute may be obtained using such low power sputtering.

The second preferred technique is by means of a low pressure chemical vapor deposition (LPCVD) process using silane at very low deposition temperatures. For example, polysilicon deposition rates of 2.0 nm to 2.5 nm per minute may be obtained with a Thermco SVG the model 7000 furnace using a furnace temperature of about 580° C. and silane. Amorphous or nearly amorphous silicon may be deposited using a furnace temperature in the range from about 550° C. to 580° C. Generally, the lower the furnace temperature, the lower the deposition rate, and the more uniform the film. A controlled rate of deposition of thin silicon films can be obtained using this temperature range in a LPCVD furnace.

Figure 2D:
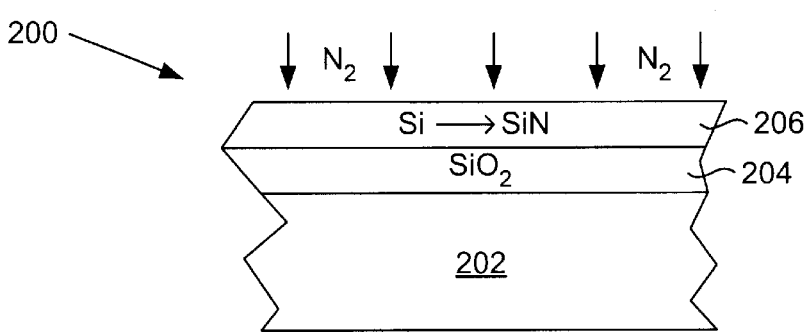

The thin silicon film 206 may then be nitridized, as shown in FIG. 2D. According to a preferred embodiment of the present invention, the wafer 200 may be introduced into a plasma reactor (not shown), such as one that is normally used for plasma etching of polysilicon. Suitable reactors can generate a plasma density and energy appropriate for the creation of ionic species having energies sufficient to break silicon-silicon bonds and penetrate the surface of the polysilicon film 206 without substantially damaging its structure. A relatively high density, such as about $10^{10}/cm^3$ to $10^{13}/cm^3$, and low energy, such as less than about 12 eV, preferably between about 5 and 10 eV, which can be separately controlled by the reactor, are preferred. The LAM 9400SE is an example of such a reactor. Molecular nitrogen may be introduced into the reactor to form the plasma containing nitrogen species which have energies of less than about 20 eV, and which are sufficient to break silicon-silicon bonds so that these nitrogen (atomic and/or molecular) entities react at the surface of the polysilicon film 206 and within several atomic layers into the film producing a nitrogen-rich surface region in the polysilicon film 206.

It should be noted that the direct low energy plasma nitridization process of the present invention preferably employs a remote plasma with active bias (remote plasma with active bias nitridization). That is, the ion energy is controlled by an active bias applied to the wafer 200, as opposed to a self-biased wafer. The application of an active bias gives the system independence from the plasma source through active control of ion energy for any system where ions in the plasma reach the wafer. This system also allows process parameters to be determined for different wafer surfaces by simulation before any nitridizations are performed.

For example, a LAM 9400SE reactor may be operated according to the following process parameters to achieve nitridization of a thin amorphous or poly silicon film deposited on an oxide, according to a preferred embodiment of the present invention: pressure of about 10 mtorr; $N_2$ flow rate of about 10 standard cubic centimeters per minute (sccm); TCP power of about 200 W; bias power of about 10 W; electrode temperature of about 60° C.; backside He pressure of about 8 torr; step time of about 10 minutes. Using these parameters, a plasma with about 10 eV nitrogen species may be produced resulting in nitridization of the thin silicon film to about 25 to 30 atomic percent.

Figure 3:
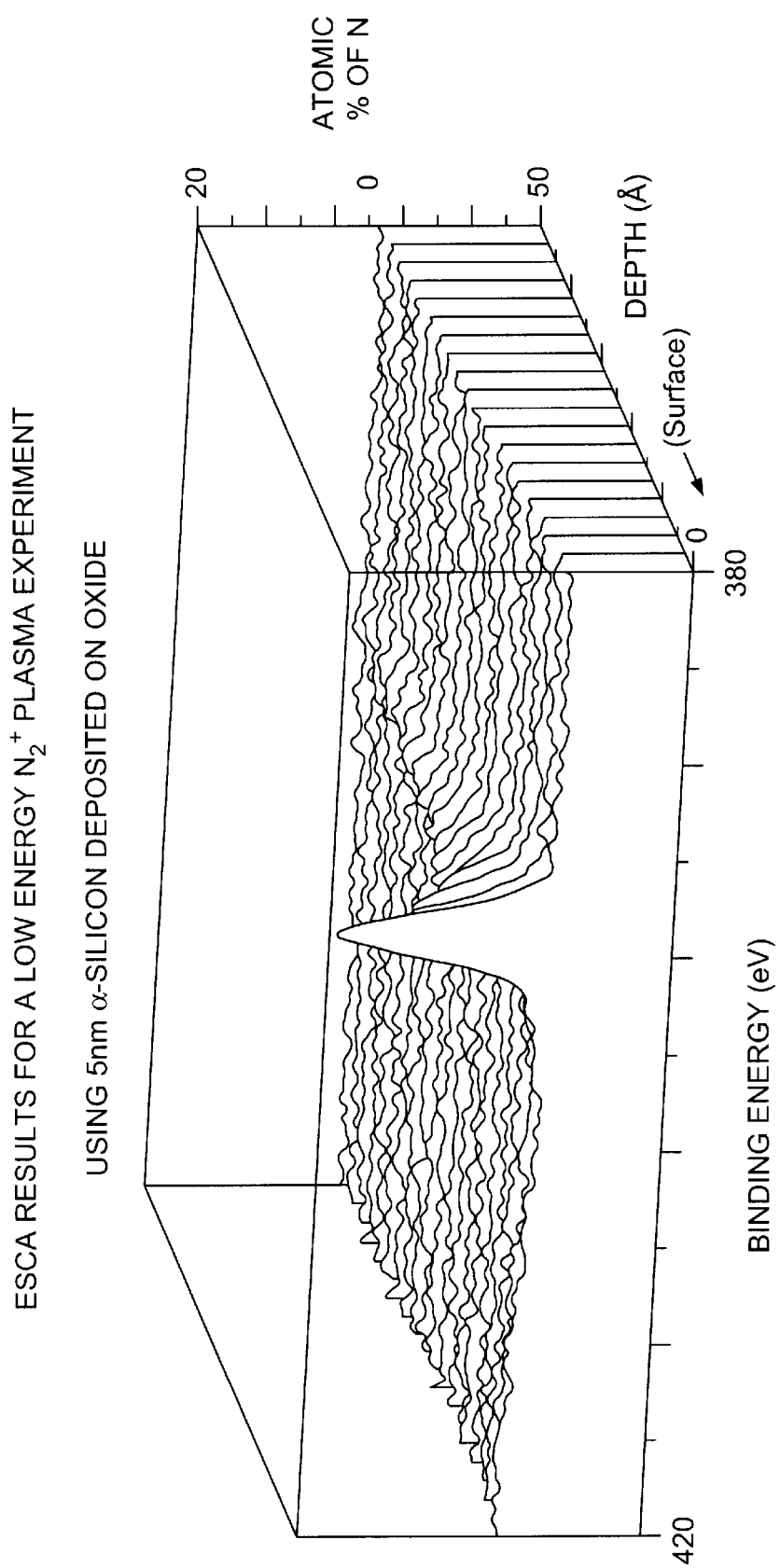
FIG. 3 shows a three-dimensional representation of the results an electron spectroscopic chemical analysis (ESCA) for a low energy nitrogen plasma implant.

FIG. 3 shows a three-dimensional representation of the results an electron spectroscopic chemical analysis (ESCA) for a low energy nitrogen plasma implant using the parameters described above. The vertical axis represents atomic percent of nitrogen, and the side axis represents the depth of the thin silicon layer, starting from the surface and moving down. The horizontal axis represents the binding energy of core electrons. The results demonstrate that nitrogen is implanted according to a gradient from the surface of the silicon film, which is about 20 atomic percent nitrogen, to the interface with the oxide, which has very little or no nitrogen content. These results illustrate another useful feature of the present invention, which is that the nitrogen which hardens the dielectric layer is isolated from the underlying oxide and substrate layers and does not affect their performance.

Figure 2E:
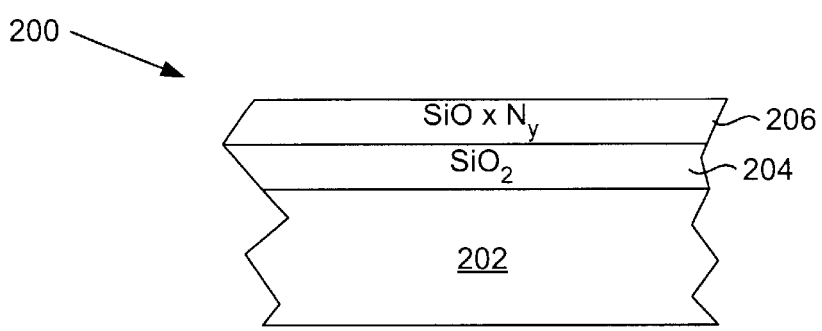

Following the nitridization the film is oxidized to convert the nitrogen-rich polysilicon or amorphous silicon layer 206 to a nitrogen-rich oxide, as shown in FIG. 2E. The oxidation may be achieved by exposure to steam or $O_2$ in a thermal reaction chamber, such as a furnace, at a temperature of about 800 to 900° C. The final gate oxide consists of two layers; a pure (or relatively pure) $SiO_2$ layer 204 that forms an interface with the single crystal silicon substrate 202, and a second $SiO_2$ layer 206 having a high percentage of oxynitride bonds. In a preferred embodiment, the composition of the second (oxynitride) layer, may also be represented by the formula $SiO_xN_y$ having a nitrogen concentration decreasing with depth, where x ranges from about 1 to 2 and y ranges from about 0 to 1. It has been found that hardened thin composite gate dielectrics according to the present invention having oxynitride layers with about 10 to 25 atomic percent nitrogen perform well. In addition, the nitridization may be achieved without substantial damage to the thin silicon layer 206 or nitrogen contamination at the oxide 204/substrate 202 interface.

Figure 4A:
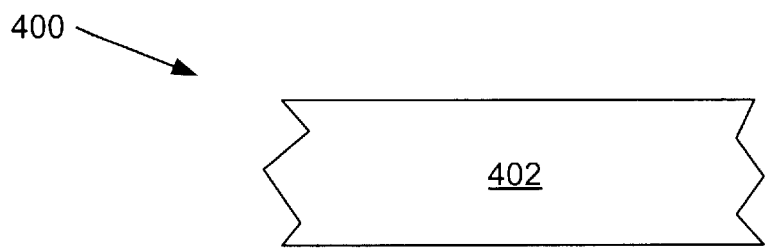
FIGS. 4A–D depict cross-sectional views of stages in the fabrication of a hardened composite thin gate dielectric according to alternate embodiments of the present invention.
Figure 4B:
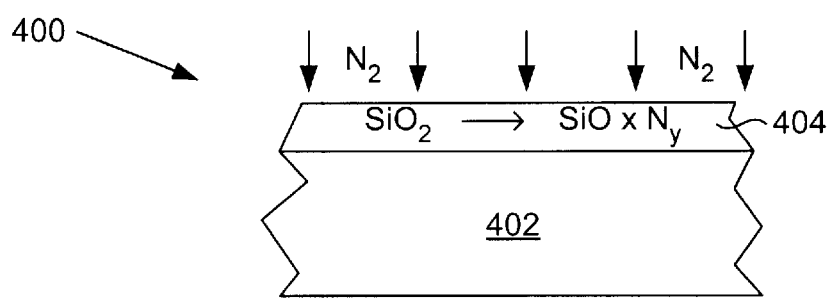

In another embodiment of the present invention, illustrated in FIGS. 4A through 4D, low energy plasma nitridization is performed by remote plasma with active bias on a thin oxide layer, followed by deposition of a very thin silicon layer and subsequent oxidation or additional low energy plasma nitridization and then oxidation of the thin silicon layer. In this embodiment, as shown in FIGS. 4A and 4B an initial thin gate oxide 404 (for example, less than about 6.0 nm, preferably about 2.5 nm thick) is formed on a silicon substrate 402 of a wafer 400 according to a method well known to those of skill in the art. This oxide layer 404 is then subjected to a low energy plasma nitridization. This nitridization may be performed as described above for a thin silicon layer, with the exception that a higher bias power is required in order for the nitrogen ions to penetrate that oxide.

For example, a LAM 9400SE reactor may be operated according to the following process parameters to achieve nitridization of a thin silicon dioxide film, according to a preferred embodiment of the present invention: pressure of about 10 mtorr; $N_2$ flow rate of about 10 standard cubic centimeters per minute (sccm); TCP power of about 200 W; bias power of about 60 W; electrode temperature of about 60° C.; backside He pressure of about 8 torr; step time of about 10 minutes. Using these parameters, a plasma with about 100 eV nitrogen species may be produced resulting in nitridization of the thin silicon oxide film to about 25 to 30 atomic percent. In a preferred embodiment, the composition of the final oxynitride layer, may also be represented by the formula $SiO_xN_y$ having a nitrogen concentration decreasing with depth, where x ranges from about 1 to 2 and y ranges from about 0 to 1.

Figure 5A:
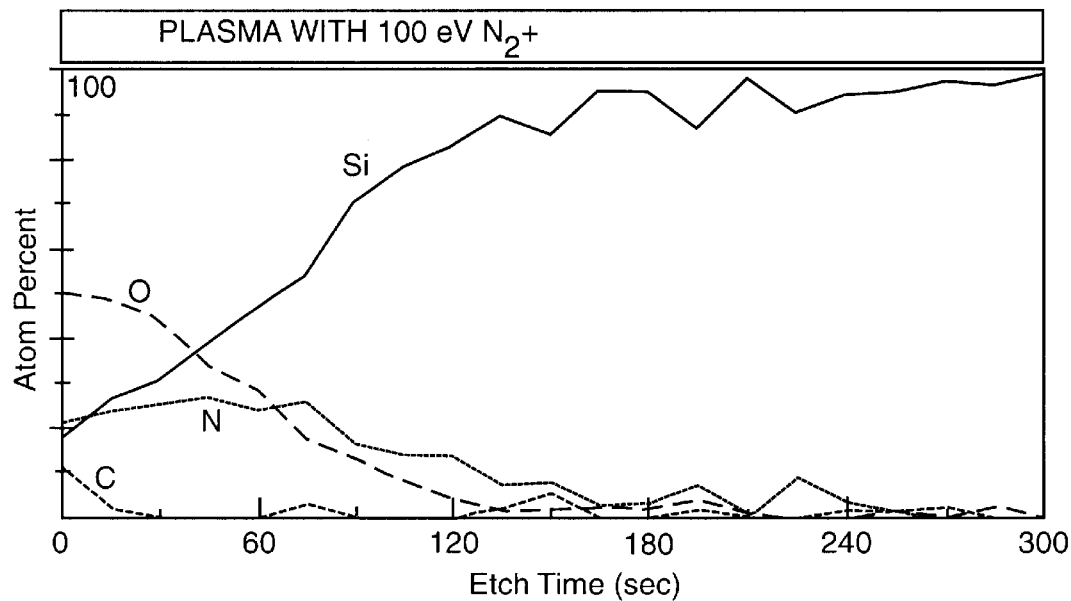
FIGS. 5A–D show graphs of the results of electron spectroscopic chemical analyses (ESCA) for low energy nitrogen plasma implants of thin oxides versus controls in which no nitridization of the oxide was performed.
Figure 5B:
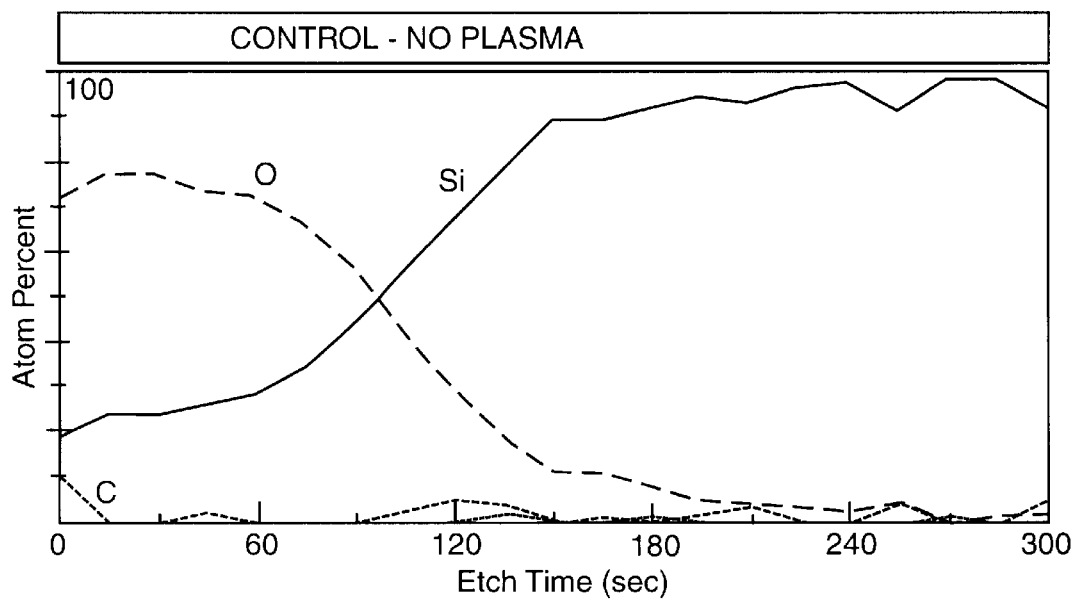
Figure 5C:
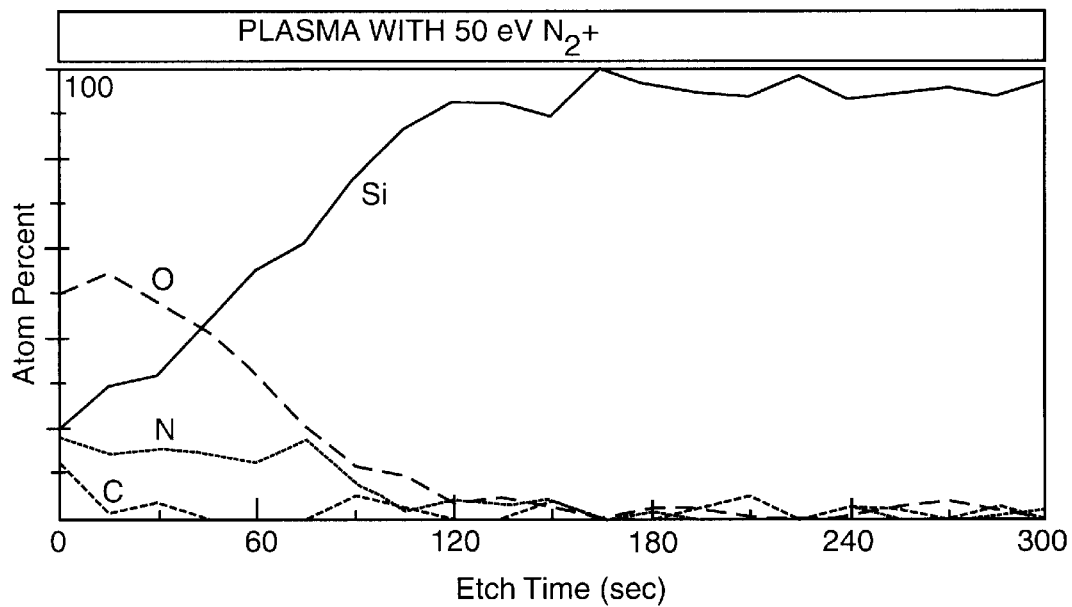
Figure 5D:
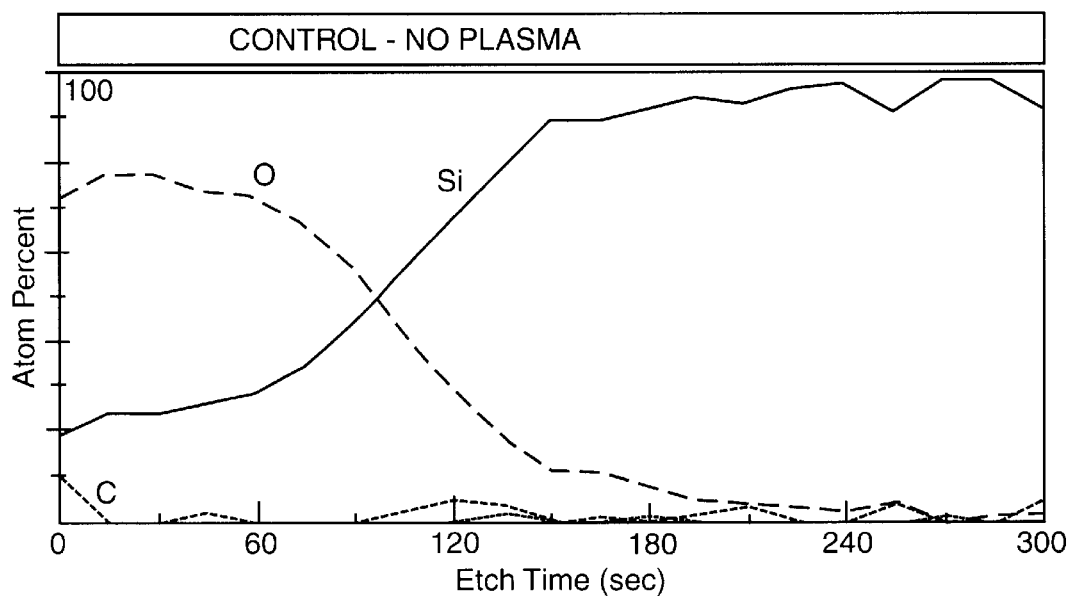

FIGS. 5A and 5B show graphs of the results an electron spectroscopic chemical analysis (ESCA) for a low energy nitrogen plasma implant of an oxide using the parameters described above (5A) versus a control in which no nitridization of the oxide was performed (5B). FIGS. 5C and 5D show graphs of the corresponding results for an oxide treated with a 50 eV nitrogen ion plasma. The vertical axis for each graph represents atomic percent of nitrogen, and the horizontal axis represents the etch time. The etcher removes about 30 Å of oxide per minute; thus, for an oxide about 60 Å thick, the oxide/substrate interface is reached in about 120 seconds. The results demonstrate that nitrogen is implanted according to a gradient from the surface of the oxide, which is about 25 atomic percent nitrogen, to the interface with the substrate, which has very little or no nitrogen content. These results illustrate the useful feature of the present invention that the nitrogen which hardens the dielectric layer is isolated from the underlying substrate layer and does not poison it.

Figure 4C:
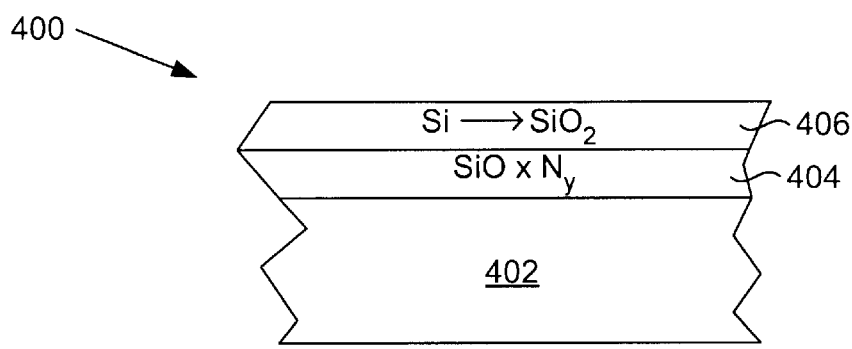

Following nitridization, a very thin silicon layer 406 (for example, less than about 5.0 nm, preferably about 1.2 nm) is deposited and the silicon is oxidized, a shown in FIG. 4C. The thin silicon layer 406 may be formed from polysilicon or amorphous silicon. As described above, such thin silicon films may be deposited on oxide by adaptation of two standard methods well known to those of skill in the art. The first preferred technique is by low powered (for example, no more than about 500 W) sputtering from a silicon target and using an argon plasma. Amorphous silicon deposition rates of less than about 3.0 nm/minute may be obtained using such low power sputtering. The oxidation may be achieved by exposure to steam or $O_2$ in a thermal reaction chamber, such as a furnace, at a temperature of about 800 to 900° C.

Figure 4D:
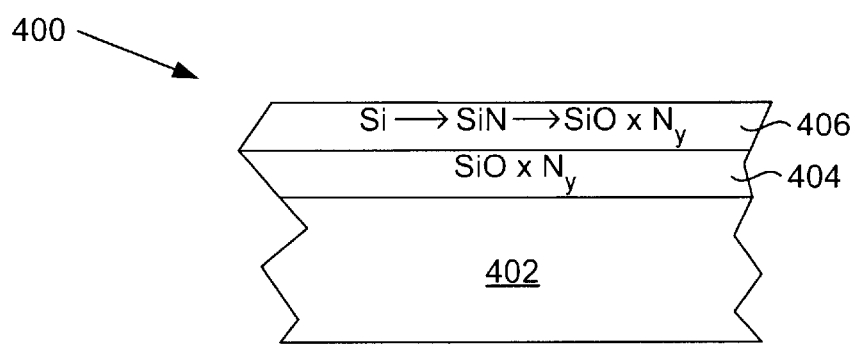

The foregoing method produces a hardened composite gate dielectric with improved performance and reliability over non-hardened gate dielectrics. Alternatively, as shown in FIG. 4D, the thin silicon layer 406 may also be subjected to low energy plasma nitridization and then oxidized to create a thin composite dielectric having two oxynitride layers. This second procedure provides the added benefit of preventing deterioration in dielectric properties by providing a nitrogen barrier to diffusion of boron from the gate electrode into the dielectric. In addition, both of these procedures reduce the undesirable side effects of the direct plasma interaction with the initial gate oxides, since they tend to favor transfer of damage generated by the low energy plasma nitridization of the initial gate oxide from that oxide to the layer of silicon undergoing oxidation (or nitridization/oxidation).

The double oxynitride layer-producing embodiment may be particularly useful where a very effective barrier layer is desired, such as where very thin polysilicon gates (for example, less than about 150 nm) with high boron dose implants are used. Moreover, this layering may be continued to create a composite dielectric having many consecutive oxynitride layers. Such a dielectric may be useful in applications requiring high dielectric capacity, such as in DRAM capacitors.

EXAMPLE

The effectiveness of the barrier to boron penetration created by the remote plasma with active bias nitridization of gate oxide, in accordance with the present invention, was verified experimentally. The gate oxide thickness was 4.5 nm, the p-channel polysilicon gate was implanted with a $BF_2^+$ base level of $3 \times 10^{15}$ $BF_2^+/cm^2$. Below is a short table of the threshold voltage results:

| Device Dimensions ($\mu$m × $\mu$m) | Control (volts) | Remote Plasma with Active Bias Nitridization (volts) |
| --- | --- | --- |
| 20 × 20 | +0.143 | −0.332 |
| 20 × 0.25 | −0.139 | −0.354 |

In the control case, enough boron penetrated the substrate to convert the long channel device to an n-channel. Short channel effects involving the punchthrough implant converted the 0.25 $\mu$m control device back to a p-channel device. The barrier created by the remote plasma with active bias nitridization has eliminated any significant boron penetration in both devices.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of making a composite gate dielectric, comprising:

providing a silicon oxide layer on a semiconductor substrate;

forming a silicon layer on said oxide layer;

nitridizing said silicon layer; and oxidizing said nitridized silicon layer to form the composite gate dielectric.

2. The method of claim 1, wherein said nitridization step comprises a remote plasma with active bias nitridization of said silicon layer.

3. The method of claim 1, wherein said silicon oxide layer has a thickness of less than about 6.0 nm.

4. The method of claim 2, wherein said silicon oxide layer has a thickness of about 2.5 nm.

5. The method of claim 1, wherein said silicon layer has a thickness of less than about 5.0 nm.

6. The method of claim 5, wherein said silicon layer has a thickness of about 1.2 nm.

7. The method of claim 1, wherein said nitridized and oxidized silicon layer comprises at least 10 atomic percent nitrogen.

8. The method of claim 7, wherein said nitridized and oxidized silicon layer comprises at least 20 atomic percent nitrogen.

9. The method of claim 1, wherein nitrogen is substantially distributed through said nitridized and oxidized silicon layer in a decreasing concentration gradient from a top surface of said nitridized and oxidized silicon layer towards said silicon oxide layer.

10. The method of claim 1, wherein said nitridized and oxidized silicon layer comprises $SiO_xN_y$ having a nitrogen concentration decreasing with depth, where x ranges from about 1 to 2 and y ranges from about 0 to 1.

11. A method of making a composite gate dielectric, comprising:

providing a first layer of silicon oxide on a semiconductor substrate;

nitridizing said silicon oxide layer;

forming a second silicon layer on said nitridized oxide layer; and oxidizing said silicon layer to form the composite gate dielectric.

12. The method of claim 11, further comprising nitridizing said oxidized silicon layer.

13. The method of claim 11, wherein said nitridization step comprises a remote plasma with active bias nitridization of said silicon oxide layer.

14. The method of claim 11, wherein said silicon oxide layer has a thickness of less than about 6.0 nm.

15. The method of claim 14, wherein said silicon oxide layer has a thickness of about 2.5 nm.

16. The method of claim 11, wherein said silicon layer has a thickness of less than about 5.0 nm.

17. The method of claim 16, wherein said silicon layer has a thickness of about 1.2 nm.

18. The method of claim 12, wherein said nitridized and oxidized silicon layer comprises at least 10 atomic percent nitrogen.

19. The method of claim 18, wherein said nitridized and oxidized silicon layer comprises at least 20 atomic percent nitrogen.

20. The method of claim 11, wherein nitrogen is substantially distributed through said nitridized silicon oxide layer in a decreasing concentration gradient from a top surface of said nitridized silicon oxide layer towards said substrate.

21. The method of claim 12, wherein nitrogen is substantially distributed through said nitridized and oxidized silicon layer in a decreasing concentration gradient from a top surface of said nitridized and oxidized silicon layer towards said silicon oxide layer.

22. The method of claim 11, wherein said first layer finally comprises $SiO_xN_y$ having a nitrogen concentration decreasing with depth, where x ranges from about 1 to 2 and y ranges from about 0 to 1.

23. The method of claim 12, wherein said second layer finally comprises $SiO_xN_y$, in a concentration decreasing with depth, where x ranges from about 1 to 2 and y ranges from about 0 to 1.

24. A method of making a composite gate dielectric, comprising:

providing on a semiconductor substrate a first layer of silicon oxide;

providing a second layer of silicon on said first layer;

nitridizing at least one of said first and second layers by remote plasma with active bias nitridization; and oxidizing said second layer to form the composite gate dielectric.

25. The method of claim 24, wherein said first layer finally comprises $SiO_xN_y$ where x ranges from about 1 to 2 and y is about 0, and said second layer finally comprises $SiO_xN_y$ having a nitrogen concentration decreasing with depth, where x ranges from about 1 to 2 and y ranges from about 0 to 1.

26. The method of claim 24, wherein said first layer finally comprises $SiO_xN_y$ having a nitrogen concentration decreasing with depth, where x ranges from about 1 to 2 and y ranges from about 0 to 1 and said second layer finally comprises $SiO_xN_y$ having a nitrogen concentration decreasing with depth, where x ranges from about 1 to 2 and y ranges from about 0 to 1.

* * * * *